United States Patent [19]

Hagiwara et al.

[11] Patent Number: 5,319,005
[45] Date of Patent: Jun. 7, 1994

[54] EPOXY RESIN MOLDING MATERIAL FOR SEALING OF ELECTRONIC COMPONENT

[75] Inventors: Shinsuke Hagiwara; Hiroyuki Kuriya, both of Shimodate; Shigeki Ichimura, Oyama, all of Japan

[73] Assignee: Hitachi Chemical Co., Ltd., Tokyo, Japan

[21] Appl. No.: 826,512

[22] Filed: Jan. 27, 1992

[51] Int. Cl.$^5$ ............................................. C08G 59/62
[52] U.S. Cl. ..................... 523/435; 525/476; 525/487; 525/523
[58] Field of Search ............ 525/476, 487, 523; 523/435; 528/27

[56] References Cited

U.S. PATENT DOCUMENTS

| | | | |
|---|---|---|---|
| 4,851,481 | 7/1989 | Kuriyama et al. | 525/454 |
| 4,853,434 | 8/1989 | Block | 525/100 |
| 4,904,761 | 2/1990 | Okitsu et al. | 523/435 |
| 4,923,912 | 5/1990 | Sasaki et al. | 523/466 |

FOREIGN PATENT DOCUMENTS

| | | |
|---|---|---|
| 0266513 | 5/1988 | European Pat. Off. |
| 0360461 | 3/1990 | European Pat. Off. |
| 0428871 | 5/1991 | European Pat. Off. |
| 1-272624 | 10/1989 | Japan |
| 2-311520 | 12/1990 | Japan |
| 3-197528 | 8/1991 | Japan |
| 3-215517 | 9/1991 | Japan |

OTHER PUBLICATIONS

Abstract for Japan 3-197528.
World Patents Index Latest, Derwent Publications Ltd., London, GB; AN 90-271584(36) & JP-A-2 191 659 (Matsushita Elec. Works) Jul. 27, 1990.
World Patents Index Latest, Derwent Publications Ltd., London GB; AN 88-326860 & JP-A-63 241 021 (Hitachi Chemical Ltd.) Oct. 6, 1988.
Patent Abstracts of Japan, vol. 14, No. 377 (C-748)(4320) Aug. 15, 1990 & JP-A-2 138 332 (Ube Ind. Ltd.) May 28, 1990.
Patent Abstracts of Japan, vol. 14, No. 412 (C-755)(4355) Sep. 6, 1990 & JP-A-2 155 914 (Sumitomo Bakelite Co. Ltd.) Jun. 15, 1990.
IEEE Transactions on Components, Hybrids and Manufacturing Technology, vol. 7, No. 3, Sep. 1984, pp. 249-256; Otsuka et al; "A New Silicone Gel Sealing Mechanism for High Reliability Encapsulation" p. 255.

*Primary Examiner*—Ralph H. Dean
*Attorney, Agent, or Firm*—Antonelli, Terry, Stout & Kraus

[57] ABSTRACT

An epoxy resin molding material for sealing of electronic components comprising
(A) an epoxy resin;
(B) a phenolic compound;
(C) a resin mixture obtained by dispersing, in a form of particulates, in a dispersion medium which is a portion or all of at least one of the epoxy resin and the phenolic compound, a mixture of a vinyl group-containing organopolysiloxane and a ≡SiH group-containing organopolysiloxane whose total volatile loss after heating at 105° C. for three hours is not more than 3% by weight, and allowing the vinyl group-containing organopolysiloxane and the ≡SiH group-containing organopolysiloxane to react with each other and to cure; and (D) an inorganic filler is excellent in thermal shock resistance, soldering resistance, moisture resistance, thermal stability, moldability and marking properties.

9 Claims, No Drawings

EPOXY RESIN MOLDING MATERIAL FOR SEALING OF ELECTRONIC COMPONENT

BACKGROUND OF THE INVENTION (a) Field of the Invention

The present invention relates to epoxy resin molding materials for sealing of electronic components, particularly, to epoxy resin molding materials which are excellent in thermal shock resistance, thermal stability and moldability and are particularly suitable for the plastic packaging of large scale integrated circuits (LSI) for surface mounting.

(b) Description of the Related Art

Epoxy resin molding materials have been mainly and widely used for the sealing of electronic components, such as transistors and integrated circuits (IC). The reason for it is that epoxy resins have well-balanced properties including the electrical properties, thermal stability, mechanical strength and adhesive properties to inserts. In particular, the combination of o-cresol novolak epoxy resins and phenol novolak hardeners brings about especially well-balanced properties, and the use of base resins of such a combination has become the mainstream in the preparation of molding materials for sealing of integrated circuits.

However, as the packages of integrated circuits are given as typical examples, packages of electronic components are being miniaturized and becoming thinner, so that cracking of packages caused by cyclic cooling and heating has become a problem. A known means of improving the thermal shock resistance of epoxy resin molding materials is the modification of epoxy resins with silicone polymers. Silicone polymers in general are immiscible in epoxy resins and disperse in a form of particulates, thereby improving the thermal shock resistance of the molding materials. Although liquid silicone polymers improve the thermal shock resistance of molding materials because of their immiscibility, they have a shortcoming of bleeding during molding, which causes flash (bleeding from the clearances in molds) and deteriorates of the appearance of molded products.

When siloxane compounds reacted previously with epoxy resins or hardeners are used in molding materials in order to prevent the bleeding during molding, usual decrease in glass transition temperature becomes a problem.

In order to solve these problems accompanying the bleeding of the liquid silicone polymers, there have been proposed some methods, for example, a method wherein self-curing liquid silicone polymers are dispersed in base resins and are then allowed to self-cure, and the solidified resin mixtures obtained thus are mixed with other ingredients (Japanese Patent Application Kokai Koho (Laid-open) No. 63-20324 and Japanese Patent Application Kokai Koho (Laid-open) No. 63-241021). Nevertheless, such methods cannot be a satisfactory measures since self-curing liquid silicone polymers contain low molecular weight volatile matters, which causes the same problems as those caused by the modification with liquid silicone polymers.

As for the thinned integrated circuit packages for surface mounting, they are different from the conventional packages for pin-insertion mounting in the method of mounting. The conventional packages for pin-insertion mounting are not exposed directly to high soldering temperatures since soldering of the pins are carried out from the reverse of a wiring board after the pins are inserted in the lead mounting holes of the wiring board. On the other hand, since the packages for surface mounting are temporarily secured on the surface of a wiring board and are then connected by dip soldering, reflow soldering or the like on the same surface of the wiring board, they are directly exposed to the soldering temperature. When the integrated circuit packages have absorbed moisture, rapid expansion of the hygroscopic moisture occurs during soldering, resulting in the cracking of the packages. This phenomenon has become to a serious problem accompanying to surface-mounted integrated circuits.

This phenomenon is also due to flexibilizers which are additives for reducing the stress generated in the interface between large scale integrated circuit chips and sealing materials. The reason is that the conventional flexibilizers are siloxane compounds, which have high permeability of moisture and decrease the strength and the adhesive properties at high temperatures.

Since the problems described above are inevitable in the integrated circuit packages of the conventional base resin compositions, there are taken measures of shipping dampproofing-packed integrated circuits or drying sufficiently integrated circuits chips prior to mounting on wiring boards. These measures, however, require much labor and high cost.

SUMMARY OF THE INVENTION

The object of the present invention is to solve the problems described above and to provide epoxy resin molding materials for sealing of electronic components which apply little stress to semiconductor devices, have excellent thermal shock resistance and good moldability and enable the mounting of integrated circuits to be performed by soldering without any particular pretreatment.

The result of the inventor's study for solving the problems has proved that the above object can be achieved by mixing epoxy base resins with silicone polymer particulates of solid state which are formed from specific organopolysiloxanes as the raw materials, and the finding has led them to complete the present invention.

That is, the present invention provides an epoxy resin molding material for sealing of electronic component, comprising:

(A) an epoxy resin having at least two epoxy groups per molecule, (B) a phenolic compound having at least two phenolic hydroxyl groups per molecule, (C) a resin mixture obtained by dispersing, in a form of particulates, in a dispersion medium which is a portion or all of at least one of the epoxy resin and the phenolic compound, a mixture of a vinyl group-containing organopolysiloxane and a ≡SiH group-containing organopolysiloxane whose total volatile loss after heating at 105° C. for three hours is not more than 3% by weight, and allowing the vinyl group-containing organopolysiloxane and the ≡SiH group-containing organopolysiloxane to react with each other and to cure, and (D) an inorganic filler.

DESCRIPTION OF THE PREFERRED EMBODIMENTS

As to the component (A) to be used in the present invention, namely the epoxy resin having at least two epoxy groups per molecule, any one used generally in known epoxy resin molding materials for sealing of electronic components can be used. Typical examples are epoxidation products of novolak resins of phenols and aldehydes, such as phenol novolak epoxy resin and o-cresol novolak epoxy resin; diglycidyl ether epoxy resins which are obtainable from the reaction of phenols, such as bisphenol A, bisphenol F, bisphenol S and alkyl-substituted biphenol, and epichlorohydrin; glycidylamine epoxy resins which are obtainable from the reaction of polyamines, such as diaminodiphenylmethane and isocyanuric acid, and epichlorohydrin; linear aliphatic epoxy resins and alicyclic epoxy resins which are obtainable by oxidation of olefinic bonds with peracids, such as peracetic acid; and brominated epoxy resins thereof.

These epoxy resins may be used individually or in combination of two or more of them.

Among various kinds of epoxy resins which may be used, a biphenyl structure epoxy resin represented by the following structural formula

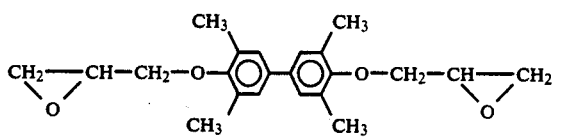

has a particularly excellent soldering resistance, and it is desirable that the epoxy resin in the epoxy resin molding material of the present invention contains at least 60% by weight of the biphenyl structure epoxy resin based on total of the epoxy resin used. By the use of the epoxy resin containing 60% by weight or more of the biphenyl structure epoxy resin, the low water absorption and the adhesive properties of the molding material of the present invention is highly improved, thereby providing very high soldering resistance. This biphenyl structure epoxy resin can be obtained by the epoxidation of 4,4'-dihydroxy-3,3',5,5'-tetramethylbiphenyl with epichlorohydrin.

It is also preferable that the epoxy resin in the epoxy resin molding material of the present invention contains brominated epoxy resins, which improve the inflammability of the epoxy resin molding material. The amount of the brominated epoxy resins is generally 2 to 10% by weight of the total of the epoxy resin molding material exclusive of the inorganic fillers.

As to the purity of the epoxy resins, particularly the content of hydrolyzable chlorine which induces the corrosion of the aluminum pattern on chips, such as integrated circuits, the lesser the hydrolyzable chlorine content, the better, and it is preferably not more than 500 ppm in order to render excellent moisture resistance to the epoxy resin molding materials for sealing of electronic components. Herein, the hydrolyzable chlorine content is determined from a value measured by a potentiometric titration of a mixture which is prepared by refluxing for 30 minutes a mixture of a solution of 1 g of a sample of epoxy resins dissolved in 30 ml of dioxane and 5 ml of 1 N-KOH methanol solution.

Typical examples of the component (B) to be used in the present invention, namely the phenolic compound having at least two phenolic hydroxyl groups per molecule are resins obtainable by condensation or polycondensation of phenols, such as phenol, creosol, xylenol, resorcinol, cathechol, bisphenol A and bisphenol F, or naphtols, such as α-naphtol, β-naphtol and dihydroxy-naphthalene, and aldehydes, such as formaldehyde, acetaldehyde, propionaldehyde, benzaldehyde and salicylaldehyde, in the presence of acidic catalysts; polyparavinylphenol resins; phenol-aralkyl resins having xylylene groups which are synthesized from phenols, α,α'-dimethoxy-p-xylene and Friedel-Crafts catalysts. These compounds may be used individually or in combination of two or more of them.

Among various kinds of the phenolic compounds which may be used as the component (B), a phenol resin represented by the following structural formula

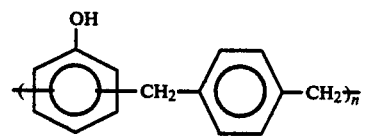

has a particularly excellent soldering resistance, and it is preferable that the phenolic compound in the epoxy resin molding material of the present invention contains at least 60% by weight of the phenol resin based on total of the phenolic compound used. By the use of the phenolic compound containing 60% by weight or more of the phenol resin, the low water absorption and the adhesive properties of the molding material of the present invention is highly improved, thereby providing high soldering resistance. Using the above-described biphenyl structure epoxy resin and this phenol resin in combination further improves the soldering resistance of the epoxy resin molding material of the present invention.

The equivalent ratio between total of the epoxy resin and total of the phenolic compound in the epoxy resin molding material [number of hydroxyl groups in the phenolic compound used/number of epoxy groups in the epoxy resin used] is not particularly limited, but it is preferably from 0.7 to 1.3 in order to reduce the amounts of unreacted matters.

The total volatile loss after heating at 105° C. for three hours of the vinyl group-containing organopolysiloxane and the ≡SiH group-containing organopolysiloxane to be used for the preparation of the component (C) should be not more than 3% by weight. When the total volatile loss of these organopolysiloxanes under the above conditions is more than 3% by weight, the volatile matters, which do not react and cure during the synthesis of the component (C), bleed on the surface of molded products to deteriorate the appearance of the surface of the molded products and to cause stain of molds, deterioration of marking properties and dropping of integrated circuit packages which are secured temporarily on wiring boards.

The main chains of the organopolysiloxanes described above are not particularly limited, but it is preferable that these organopolysiloxanes are not visually miscible in the resins (components (A) and (B)). From this viewpoint, the preferred are liquid organopolysiloxanes obtained by introducing vinyl groups or ≡SiH groups to the molecule ends or in the molecules of homopolymers or copolymers of siloxanes, such as dimethylsiloxane, methylphenylsiloxane and diphenylsiloxane. The molecular weights thereof are not particularly limited so far as their volatile losses are less than the value described above.

The ratios of the vinyl group-containing organopolysiloxane and the ≡SiH group-containing organopolysiloxane used are not particularly limited, but the preferred equivalent ratio of vinyl groups to ≡SiH groups is from 1:1 to 1:2. If the equivalent ratio is beyond the range, unreacted organopolysiloxanes may increase so as to deteriorate the appearance of the molded products and the marking properties and to affects a bad influence upon the temporary securing to wiring boards, thereby inhibiting the achievement of the object of the present invention. The catalysts to be used for the curing reaction between these organopolysiloxanes may be conventional addition catalysts, for example platinum catalysts, such as platinic chloride.

The resin mixture (C) wherein the cured reaction products of these organopolysiloxanes are dispersed in a dispersion medium in a state of particulates is obtained by dispersing, in a state of particulates, a mixture of these organopolysiloxanes in a dispersion medium, which is a portion or all of at least one of the epoxy resin and the phenolic compound to be used in the epoxy resin molding material, and then, according to demand, heating.

Dispersion stabilizers may be added for stabilizing the particulates dispersion. Typical examples of the dispersion stabilizers which may be used include nonionic surfactants, such as polyoxyalkylenes, and polyoxyalkylene-modified organopolysiloxanes, which can be added to molding materials.

The preferred volume ratio of the total of the organopolysiloxanes used as raw materials to the dispersion medium is from 1:2 to 1:10. If the volume ratio is more than 1:2, the organopolysiloxanes may become difficult to disperse in a state of particulates, and if it is less than 1:10, the increase in the amount of the dispersion medium will be unfavorable in the cost of production.

The preferred weight ratio of the total of the organopolysiloxanes used as raw materials to the total of the epoxy resin and the phenolic resin in the epoxy resin molding material of the present invention is from 1:100 to 1:5, more preferably from 1:30 to 1:10.

The method of dispersing the organopolysiloxane mixture is not particularly limited, and any apparatus capable of sufficient dispersing operation may be used, for example, reaction vessels equipped with agitating means, heating kneaders, static mixers and homogenizers. When the dispersion medium is solid at room temperature, the preparation of the resin mixture (C) is carried out under heating to bring the dispersion medium into melted state, and when it is liquid at room temperature, the procedure may be carried out at room temperature.

After the organopolysiloxane mixture is dispersed thus in the dispersion medium in a state of particulates, the organopolysiloxane mixture is cured in the state of dispersed particulates by allowing it to react at room temperature to 150° C. for 10 minutes to 10 hours. The reaction step may be conducted in the same apparatus wherein the dispersion of the organopolysiloxane mixture was carried out, or may be conducted in another apparatus, such as a thermostat, after completion of the dispersing procedure.

As to the particle size of the particulates of the reaction product of the organopolysiloxane mixture dispersed in the resin mixture (C) obtained thus, it is preferable that at least 90% by weight of the particulates have a particle size of 100 μm or less. Further, the preferred mean particle size is 50 μm or less. The particle size has effects on the moldability of the epoxy resin molding material at the time of sealing or packaging of electronic components. Generally, the gate size of molds for molding sealed electronic components, such as integrated circuits or transistors, is approximately 0.5 mm at the narrowest part, and there is danger of the gates becoming plugged unless 90% by weight or more of the particulates have a particle size of not more than 100 μm. A particle size of not more than 100 μm is also desirable for preventing the bonding wire connecting a chip and leads from being tortured during molding. Particulates having a mean particle size of 50 μm or less have significant effects of improving the thermal shock resistance.

The hardness of the particulates of the reaction products of the organopolysiloxanes can be adjusted to a desired degree by selecting the functional groups' equivalent weights and the ratios of the numbers of vinyl groups and ≡SiH groups of the two kinds of organopolysiloxanes to be used, and the softer the particulates are, the higher the resistance to package cracking is improved.

Uniform dispersion of such soft solid particulates in molding materials brings about an outstanding improvement of the thermal shock resistance, typically the resistance to package cracking, without decreasing the glass transition temperature.

Solid silicone particulates are further characterized in the excellent soldering resistance. While the addition of resins modified with the conventional silicone oils or reactive silicone oils decreases the strength of molded products and the adhesive strength to inserts, such as chips and islands, at soldering temperatures, the addition of solid particulates enables preservation of the high strength. In particular, when low melt viscosity resins, such as the above-described biphenyl structure epoxy resin, are used, the dispersibility of silicones is apt to decrease. On the other hand, the solid silicone particulates used in the present invention exhibit a stable dispersibility even in low melt viscosity resins since the particle size can be properly adjusted at the time of synthesis thereof.

Further, not only because the organopolysiloxanes are added after modified into solid particulates, but because the volatile loss of the raw organopolysiloxanes is little, molded products and molds are free from the problem accompanying the conventional epoxy resin molding materials modified with siloxane compounds, namely stain due to the bleeding of siloxane compounds during molding. The bleeding of siloxane compounds from molded products causes problems including deterioration of appearance and decreased marking properties, and the stain of molds necessitates cleaning of molds at frequent intervals. Particularly, cleaning of molds requires much labor and time, and the use of molding materials causing no stain is advantageous in productivity.

The epoxy resin molding material for sealing of electronic components of the present invention may further contain cure accelerators which accelerate the curing reaction of the epoxy resins and the phenolic compounds having phenolic hydroxyl groups. Typical examples of the cure accelerators are tertiary amines, such as 1,8-diazabicyclo(5,4,0)undecene-7, triethylenediamine, benzyldimethylamine, triethanolamine, dimethylaminoethanol and tris(dimethylaminomethyl)-phenol; imidazoles, such as 2-methylimidazole, 2-phenylimidazole, 2-phenyl-4-methylimidazole and 2-heptadecylimidazole; organic phosphines, such as tributylphosphine, methyldiphenylphosphine, triphenylphosphine, diphenylphosphine and phenylphosphine; and tetraphenylborates, such as tetraphenylphosphonium tetraphenylborate, triphenylphosphine tetraphenylborate, 2-ethyl-4-methylimidazole tetraphenylborate and N-methylmorpholine tetraphenylborate.

The epoxy resin molding material for sealing of electronic components of the present invention further contains an inorganic filler as a component (D). Typical examples of the inorganic filler are crushed or spherical (beaded) powder of fused silica, crystalline silica, alumina, zircon, calcium silicate, calcium carbonate, silicon carbide, silicon nitride, beryllia, zirconia; single crystal fiber of potassium titanate, silicon carbide, silicon nitride, alumina; and glass fiber. These inorganic fillers may be used individually or in combination of two or more of them. In order to decrease the water absorption and coefficient of thermal expansion and to increase the strength, the amount of the inorganic fillers added is preferably at least 70% by volume, more preferably from 70 to 80% by volume of the total of the epoxy resin molding material. Among the inorganic fillers described above, the preferred are fused silica from the viewpoint of decreasing the coefficient of thermal expansion, and alumina from the view point of high thermal conductivity. The shape of the inorganic fillers is preferably spherical for purposes of increasing the flowability of the molding materials and of preventing the abrasion of the molds during molding.

Further, the epoxy resin molding material for sealing of electronic components of the present invention may also contain release agents, such as higher fatty acids, metal salts of higher fatty acids, ester wax and polyethylene wax, coloring agents, such as carbon black, coupling agents, such as epoxysilanes, aminosilanes, alkylsilanes, vinylsilanes, organic titanates and aluminum alcoholates.

The molding material of the present invention may be prepared from the components (A), (B), (C) and (D) described above by, in general, mixing sufficiently the predetermined amounts of these components with a mixer, kneading the mixture with heated rolls or an extruder, cooling the kneaded mixture, and then pulverizing the cooled mixture.

The most general method of sealing electronic components with the molding material thus obtained is a low pressure transfer molding, and other techniques, such as injection molding, compression molding and casting, may also be employed.

The epoxy resin molding material of the present invention is excellent in soldering resistance, thermal shock resistance and moldability, and, as well, is advantageous in the preparation thereof. That is, according to the present invention, soft rubbery solid particulates having a particle size of not more than 100 μm can be blended in molding materials with a low cost. Generally, preparation of rubberty matters having particle size of not more than 100 μm from bulky rubberty matters by pulverization is difficult, and it requires high cost. Also, other known methods of preparing particulates of organopolysiloxanes by means of emulsion polymerization or suspension polymerization requires removal of dispersion mediums and removal of surfactants. Contrary to the latter methods, the dispersion medium used in the present invention is the same resin as at least one of the base resins of the molding material, so that the dispersion medium can be incorporated together with the dispersed and cured organopolysiloxanes into the molding material. Therefore, the epoxy resin molding material of the present invention is also extremely advantageous in the aspect of cost. Further, there is no possibility of cohesion of the soft particulates since the particulates of the reacted and cured organopolysiloxane are not collected separately but are treated as they are dispersed in the dispersion medium.

As described above, the epoxy resin molding material of the present invention has excellent characteristics not only in the mechanical properties but also in the preparation thereof.

The reason why the epoxy resin molding materials of the present invention are excellent in soldering resistance, thermal shock resistance, thermal stability and moldability is that a resin base comprising the epoxy resin (A) and the phenolic compound (B) is modified by a specific flexibilizer which is a resin mixture prepared by dispersing, in a dispersion medium which is at least one of the epoxy resin (A) and the phenolic compound (B), a mixture of reactive organopolysiloxanes which contain little volatile matters and immiscible in the dispersion medium, and then allowing to react and cure the organopolysiloxanes dispersed in a state of particulates.

That is, since the reaction products of the organopolysiloxanes in the component (C) are solid rubberty particulates which are generally not more than 100 μm in particle size and which are uniformly dispersed in the molding material, excellent thermal shock resistance is brought about. Also, since the reaction products and the base resin are immiscible to form separated phase system in the molding material, the glass transition temperature innate in the base resin is not decreased, thereby bringing about good thermal stability.

Further, comparing with the cases where liquid siloxane compounds are added or epoxy base resin or hardeners are modified with siloxane compounds, the epoxy resin molding material of the present invention has excellent strength and adhesive properties at high temperatures, and therefore high soldering resistance is exhibited.

With respect to moldability, since the reaction products of the organopolysiloxanes in the component (C) are dispersed in the molding material in solid state and contain little volatile matters, there is no possibility of bleeding of volatile matters during molding nor stain of molded products and molds.

It is presumed that the epoxy resin molding material of the present invention is excellent in the properties including soldering resistance, thermal shock resistance, thermal stability and moldability for the reasons described above.

EXAMPLES 1 TO 5 AND COMPARATIVE EXAMPLES 1 TO 5

Preparation of component (C)

Into 300 ml flask was placed 120 g of o-cresol novolak epoxy resin having an epoxy equivalent weight of 220 and a softening point of 67° C. as a dispersion medium and was melted at 90° C., and a mixture of 7.1 g of a pendant vinyl group-modified polydimethylsiloxane having an equivalent weight of 3400, 22.9 g of a hydrogen terminated polydimethylsiloxane having an equivalent weight of 7300 and 1 mg of platinic chloride was added thereto with stirring, and was then allowed to react for one hour, to obtain a flexibilizer (1).

The procedure of the preparation of the flexibilizer (1) was repeated with the exception that the dispersion medium was replaced by 120 g of a biphenyl structure epoxy resin having an epoxy equivalent weight of 188 and a melting point of 106° C. (Trade name: EPIKOTE YX-4000H produced by Yuka Shell Epoxy Kabushiki Kaisha) and the procedure was carried out at 110° C., to obtain a flexibilizer (2).

The procedure of the preparation of the flexibilizer (1) was repeated with the exception that the dispersion medium was replaced by 120 g of a phenol-aralkyl resin having a hydroxyl equivalent weight of 167 and a softening point of 70° C. (Trade name: MILEX XL-225 produced by Mitsui Toatsu Chemicals, Inc.), to obtain a flexibilizer (3).

The polysiloxane compounds used in the preparation of the flexibilizers (1) to (3) had previously been treated respectively at 150° C. for 5 hours at a pressure not higher than 10 mmHg to remove the volatile matters. The volatile losses of the treated polysiloxane compounds after further treatment at 105° C. for three hours were 0.5% by weight with respect to the pendant vinyl group-modified polydimethylsiloxane and 1.5% by weight with respect to the hydrogen terminated polydimethylsiloxane. Prior to the former treatment for the removal of volatile matters, the volatile loss of the pendant vinyl group-modified polydimethylsiloxane was 5.4% by weight, and that of the hydrogen terminated polydimethylsiloxane was 7.2% by weight, and the procedures of the preparation of the flexibilizer (1) and the preparation of the flexibilizer (2) were repeated with the exception that the siloxane compounds not treated to remove the volatile matters were used, to obtain a flexibilizer (4) and a flexibilizer (5), respectively.

When the flexibilizers (1) to (5) were dissolved in acetone to remove the dispersion mediums used, the isolated reaction products of the organopolysiloxanes were solid soft powder of an approximately spherical shape, and most of the particles were approximately 5 to 30 μm in diameter, and particles of 100 μm or more did not exist.

Preparation of epoxy resin molding material

The molding materials of Examples 1 to 5 and Comparative Examples 1 to 5 were prepared by mixing an o-cresol novolak epoxy resin having an epoxy equivalent weight of 220 and a softening point of 67° C., a biphenyl structure epoxy resin having an epoxy equivalent weight of 188 and a melting point of 106° C. (EPIKOTE YX-4000H), a brominated bisphenol A epoxy resin having an epoxy equivalent weight of 375, a softening point of 80° C. and a bromine content of 48% by weight, a phenol novolak resin having a hydroxyl group eqivalent weight of 106 and a softening point of 83° C., a phenol-aralkyl resin having a hydroxyl equivalent weight of 167 and a softening point of 70° C. (MILEX XL-225), 1,8-diazabicyclo(5,4,0)undecene-7, carnauba wax, antimony trioxide, carbon black, γ-glycidoxypropyltrimethoxysilane as a coupling agent, fused silica powder and the flexibilizers (1) to (5) in the weight rations as shown in Table 1, carrying out roll kneading at a kneading temperature of from 80° to 90° C. for a kneading time of 10 minutes.

The properties of the molding materials obtained in Examples 1 to 5 and Comparative Examples 1 to 5 are shown in Table 2, and evaluation methods of the properties are shown in Table 3.

The results show that all of the molding materials obtained in Examples 1 to 5 are excellent in the thermal shock resistance, soldering resistance, moisture resistance, appearance of the molded products and marking properties. As shown by the results of Comparative Examples 3 to 5, the use of silicone flexibilizers as flexibilizer also rendered good thermal shock resistance and high moisture resistance to the molding material. However, in these cases, the appearance and marking properties of the molded products were adversely affected by the silicone flexibilizers. While the preparations of the flexibilizers and molding materials of Comparative Examples 4 and 5 were carried out under the same conditions as those in Examples 1 and 3, respectively, the mere difference in the content of volatile matters caused a great difference in the appearance and marking properties of the molded products. Further, comparing Examples 4 and 5 with Comparative Example 3, wherein the same resinous materials, inorganic filler and additives were used in the same amounts, shows that these Examples 4 and 5 attained higher adhesive strength accompanied by better soldering resistance than Comparative Example 3 wherein the conventional silicone oil was used. Although it is a general knowledge that addition of silicone flexibilizer decreases soldering resistance, comparison of Examples 1 and 4 with Comparative Examples 1 and 2 shows that the flexibilizers prepared according to the present invention have no adverse effects on soldering resistance. With respect to the effects of the base resins, the soldering resistance becomes higher in the order, Example 1, Example 3, Example 4. This effect is taken by the use of the biphenyl structure epoxy resin in place of the conventional epoxy resins and the use of the phenol-aralkyl resin as a hardener, and the use of a base resin consisting of these resins is particularly effective for improving soldering resistance.

TABLE 1

| Composition of molding material (wt. part) | Example Nos. | | | | | Comparative Example Nos. | | | | |
|---|---|---|---|---|---|---|---|---|---|---|
| | 1* | 2* | 3* | 4* | 5* | 1 | 2 | 3 | 4* | 5* |
| Epoxy resin | | | | | | | | | | |
| o-Cresol novolak epoxy resin | 40 | — | — | — | — | 80 | — | — | 40 | — |
| Biphenyl skeleton epoxy resin (YX-4000H) | — | 40 | 40 | 40 | 80 | — | 80 | 80 | — | 40 |
| Brominated epoxy resin | 20 | 20 | 20 | 20 | 20 | 20 | 20 | 20 | 20 | 20 |
| Phenolic compound (hardener) | | | | | | | | | | |
| Phenol novolak resin | 44 | 51 | 51 | — | — | 44 | — | — | 44 | 51 |
| Phenol-aralkyl resin (XL-225) | — | — | — | 80 | 40 | — | 80 | 80 | — | — |
| Resin mixture (flexibilizer) | | | | | | | | | | |
| Flexibilizer (1) | 50 | — | — | — | — | — | — | — | — | — |
| Flexibilizer (2) | — | 50 | 50 | 50 | — | — | — | — | — | — |
| Flexibilizer (3) | — | — | — | — | 50 | — | — | — | — | — |
| Flexibilizer (4) | — | — | — | — | — | — | — | — | 50 | — |
| Flexibilizer (5) | — | — | — | — | — | — | — | — | — | 50 |
| Silicone oil (10,000 cp) | — | — | — | — | — | — | — | 10 | — | — |
| Additives | | | | | | | | | | |
| DBU * | 2 | 2 | 2 | 2 | 2 | 2 | 2 | 2 | 2 | 2 |

TABLE 1-continued

| Composition of molding | Example Nos. | | | | | Comparative Example Nos. | | | | |
|---|---|---|---|---|---|---|---|---|---|---|
| material (wt. part) | 1 * | 2 * | 3 * | 4 * | 5 * | 1 | 2 | 3 | 4 * | 5 * |
| Carnauba wax | 2 | 2 | 2 | 2 | 2 | 2 | 2 | 2 | 2 | 2 |
| Antimony trioxide | 8 | 8 | 8 | 8 | 8 | 8 | 8 | 8 | 8 | 8 |
| Carbon black | 1.5 | 1.5 | 1.5 | 1.5 | 1.5 | 1.5 | 1.5 | 1.5 | 1.5 | 1.5 |
| Coupling agent | 3 | 3 | 3 | 3 | 3 | 3 | 3 | 3 | 3 | 3 |
| Inorganic filler | 70 | 70 | 74 | 74 | 74 | 70 | 74 | 74 | 70 | 74 |
| Fused silica powder (volume %) | | | | | | | | | | |

* Each of the flexibilizers of Examples 1 to 5 and Comparative Examples 4 and 5 contains an epoxy resin or a phenolic compound, and each flexibilizer was added in such an amount that the total amount of the silicone (i.e. the total amounts of the organopolysiloxanes used) in one molding material became 10 parts by weight.
** 1,8-diazabicyclo(5,4,0)undecene-7

TABLE 2

| Properties of molding material | Example Nos. | | | | | Comparative Example Nos. | | | | |
|---|---|---|---|---|---|---|---|---|---|---|
| | 1 | 2 | 3 | 4 | 5 | 1 | 2 | 3 | 4 | 5 |
| Spiral flow (in) | 30 | 52 | 33 | 35 | 33 | 35 | 41 | 34 | 35 | 38 |
| Appearance of molded product | good | good | good | good | good | good | good | bad | clouded | clouded |
| Critical surface tension (mN/m) | 30 | 30 | 30 | 30 | 30 | 32 | 32 | 26 | 27 | 27 |
| Marking strength (the number of times) | >30 | >30 | >30 | >30 | >30 | >30 | >30 | 5 | 17 | 20 |
| Adhering strength (N/m) | | | | | | | | | | |
| Room temperature | 420 | 630 | 690 | 850 | 860 | 400 | 840 | 520 | 380 | 750 |
| 215° C. | 150 | 100 | 140 | 160 | 160 | 150 | 170 | 110 | 130 | 130 |
| Water absorption (wt. %) | | | | | | | | | | |
| 24 hours | 0.15 | 0.11 | 0.08 | 0.07 | 0.07 | 0.12 | 0.06 | 0.07 | 0.15 | 0.07 |
| 72 hours | 0.21 | 0.18 | 0.14 | 0.11 | 0.11 | 0.18 | 0.10 | 0.12 | 0.21 | 0.12 |
| Thermal shock resistance (50%-crack-occuring cycles) | >2000 | >2000 | >2000 | >2000 | >2000 | 1200 | 1800 | >2000 | >2000 | >2000 |
| Soldering resistance (h) (humidifying time taken to cause crack) | 72 | 96 | 120 | 168 | 168 | 72 | 168 | 72 | 72 | 168 |
| Moisture resistance (h) (time taken to cause 50%-failure) | >1000 | >1000 | >1000 | >1000 | >1000 | 200 | 500 | >1000 | >1000 | >1000 |

TABLE 3-1

| Properties | Measuring method (Standard) | Measuring apparatus | Conditions | Remarks |
|---|---|---|---|---|
| Spiral flow | EMMI 1-66 | Spiral flow mold | 180° C. 70 kg/cm² | Flowed length was measured. |
| Appearance of molded products | — | Disc mold (φ100 × t3) | 180° C. 70 kg/cm² | Discs were molded and their appearance was visually observed. |
| Critical surface tension | JIS-K-6768 | Surface tension test standard solution | Room Temp. Discs for evaluation | of appearance were used. |
| Adhesive strength | — | Tension tester (produced by Shimazu Seisakusho Co., Ltd.) | Room Temp. and 215° C. | Peel strength of aluminum foil of 50 μm thick |

TABLE 3-2

| Water absorption | JIS-K-6911 | Analytical balance | 85° C. 85% RH | Percentage of weight change of molded products (φ50 × t3) |
|---|---|---|---|---|
| Marking strength | IC: standard DIP 16 pins (Marking was done on a mirror finished surface.) Marking: thermosetting ink *, 150° C., one hour curing Evaluation: The number of times of rubbing with a cotton applicator until the mark which had been subjected to dipping in trichloroethylene for 10 minutes became blurred. | | | |
| Thermal shock resistance (cracking of IC packages) | IC: flat package, 19 × 14 × 2.7 (mm), 54 pins, alloy 42 lead frame, chip 6 × 6 × 0.4 (mm) Molding: 180° C., 70 kg/cm², 90 sec + 180° C., 5 hours Test: 150° C. (oil) / liquid nitrogen, 2 minutes, respectively (one cycle) Evaluation: The presence of cracks in 20 packages was observed by microscopic observation. | | | |
| Soldering resistance (cracking of IC packages) | IC: flat package, 19 × 14 × 2.7 (mm), 54 pins, alloy 42 lead frame, chip 6 × 6 × 0.4 (mm) Molding: 180° C., 70 kg/cm², 90 sec + 180° C., 5 hours Test: After the IC packages were humidified under the conditions of 85° C., 85% RH, a VPS ** was carried out at 215° C. for 90 seconds. Evaluation: The presence of cracks in 20 packages was observed by microscopic observation. | | | |
| Moisture resistance (corrosion of aluminum pattern in IC chips) | IC: flat package, 19 × 14 × 2.7 (mm), 54 pins, alloy 42 lead frame, chip 6 × 6 × 0.4 (mm) Chip: the sample chips were produced by forming an oxidated layer of 1 μm thick on silicon substrates and providing on the oxidated layer an aluminum pattern of 10 μm in line width, 1 μm thick. Test: humidifying at 85° C., 85% RH, 72 hours, VPS treatment at 215° C. for 90 seconds, and exposure to 2 atm PCT for a predetermined time, in this order. Evaluation: Electric failure due to corrosion of aluminum pattern was checked. | | | |

* 7261 (silver) produced by Markem-Asiatic Co., Inc.
** Vapor Phase Soldering

What is claimed is:

1. An epoxy resin molding material for sealing of an electronic component, comprising:
   (A) an epoxy resin having at least two epoxy groups per molecule,
   (B) a phenolic compound having at least two phenolic hydroxyl groups per molecule,
   (C) a resin mixture obtained by dispersing a mixture of a vinyl group-containing organopolysiloxane and a ≡SiH group-containing polysiloxane in a dispersion medium which is at least one of an epoxy resin having at least two epoxy groups per molecule and a phenolic compound having at least two phenolic hydroxy groups per molecule so that the mixture of the vinyl group-containing organopolysiloxane and the ≡SiH group-containing organopolysiloxane is dispersed in the form of particulates in the dispersion medium, the mixture of the vinyl group-containing organopolysiloxane and the ≡SiH group-containing organopolysiloxane, prior to being dispersed, exhibiting a total volatile loss of not more than 3% by weight after heating at 105° C. for three hours, the vinyl group-containing organopolysiloxane being a liquid organopolysiloxane obtained by introducing vinyl groups to the molecule ends or in the molecule of an organopolysiloxane selected from the group consisting of a homopolymer of dimethylsiloxane, a homopolymer of methylphenylsiloxane, a homopolymer of diphenylsiloxane, a copolymer of dimethylsiloxane and methylphenylsiloxane, a copolymer of methylphenylsiloxane and diphenylsiloxane, a copolymer of dimethylsiloxane and diphenylsiloxane and a copolymer of dimethylsiloxane, methylphenylsiloxane and diphenylsiloxane; the ≡SiH group-containing organopolysiloxane being a liquid organopolysiloxane obtained by introducing ≡SiH groups to the molecule ends or in a molecule of an organopolysiloxane selected from the group consisting of a homopolymer of dimethylsiloxane, a homopolymer of methylphenylsiloxane, a homopolymer of diphenylsiloxane, a copolymer of dimethylsiloxane and methylphenylsiloxane, a copolymer of methylphenylsiloxane and diphenylsiloxane, a copolymer of dimethylsiloxane and diphenylsiloxane and a copolymer of dimethylsiloxane, methylphenylsiloxane and dimethylsiloxane, the ratio of the amount of the vinyl group-containing organopolysiloxane to the amount of the ≡SiH group-containing organopolysiloxane being such that the equivalent ratio of vinyl groups to ≡SiH groups is from 1:1 to 1:2, and
   by causing the vinyl group-containing organopolysiloxane and the ≡SiH group-containing organopolysiloxane to react with each other and to cure, and
   (D) an inorganic filler,
   at least 60% by weight of the epoxy resin in the epoxy resin molding material being an epoxy resin represented by the following formula:

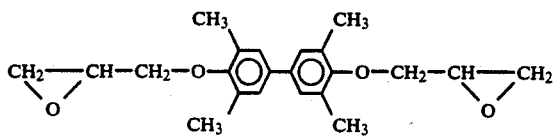

based on the total epoxy resin, and the phenolic compound being a phenol resin comprising the repeating units represented by the following general formula:

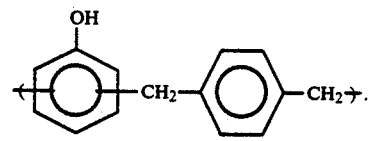

2. The epoxy resin molding material for sealing of an electronic component as claimed in claim 1, wherein the epoxy resin molding material contains at least 70% by volume of the inorganic filler (D) based on the total of the epoxy resin molding material.

3. The epoxy resin molding material for sealing of an electronic component as claimed in claim 1, wherein the dispersion medium contained in the resin mixture (C) is an epoxy resin represented by the formula

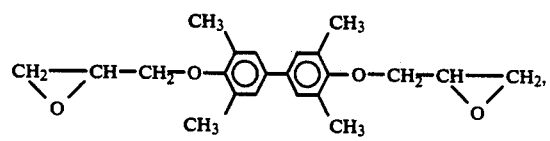

and the volume ratio of the total volume of the vinyl group-containing organopolysiloxane and the ≡SiH group-containing organopolysiloxane used for the preparation of the resin mixture (C) to the volume of the epoxy resin in the resin mixture (C) is from 1:2 to 1:10.

4. The epoxy resin molding material for sealing of an electronic component as claimed in claim 3, wherein the epoxy resin molding material contains at least 70% by volume of the inorganic filler (D) based on the total of the epoxy resin molding material.

5. The epoxy resin molding material for sealing of an electronic component as claimed in claim 1, wherein the dispersion medium contained in the resin mixture (C) is a phenol resin comprising the repeating unit represented by the following formula

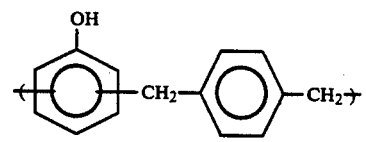

and the volume ratio of the total volume of the vinyl group-containing organopolysiloxane and the ≡SiH group-containing organopolysiloxane used for the preparation of the resin mixture (C) to the volume of the phenol resin in the resin mixture (C) is from 1:2 to 1:10.

6. The epoxy resin molding material for sealing of an electronic component as claimed in claim 5, wherein the epoxy resin molding material contains at least 70% by volume of the inorganic filler (D) based on the total of the epoxy resin molding material.

7. The epoxy resin molding material for sealing of an electronic component as claimed in claim 1, wherein the volume ratio of the total of the organopolysiloxanes in the resin mixture (C) to the dispersion medium is from 1:2 to 1:10 and the weight ratio of the total of the organopolysiloxanes in the resin mixture (C) to the total of the epoxy resin (A), the phenolic resin (B) and the dispersion medium is from 1:100 to 1:5.

8. The epoxy resin molding material for sealing of an electronic component as claimed in claim 1, wherein the vinyl group-containing organopolysiloxane is a pendant vinyl group-modified polydimethylsiloxane, and the ≡SiH group-containing organopolysiloxane is a hydrogen terminated polydimethylsiloxane.

9. The epoxy resin molding material for sealing of an electronic component as claimed in claim 1, wherein the epoxy resin molding material contains from 70 to 80% by volume of the inorganic filler based on the volume of the epoxy resin molding material.

* * * * *